(12) United States Patent
Chandrasekaran et al.

(10) Patent No.: US 9,444,442 B2
(45) Date of Patent: Sep. 13, 2016

(54) OPEN-LOOP CORRECTION OF DUTY-CYCLE ERROR AND QUADRATURE PHASE ERROR

(71) Applicant: RAMBUS INC., Sunnyvale, CA (US)

(72) Inventors: Srinivasaraman Chandrasekaran, Bangalore (IN); Gundlapalli Shanmukha Srinivas, Bangalore (IN)

(73) Assignee: RAMBUS INC., Sunnuyvale, CA (US)

( * ) Notice: Subject to any disclaimer, the term of this patent is extended or adjusted under 35 U.S.C. 154(b) by 306 days.

(21) Appl. No.: 14/165,370

(22) Filed: Jan. 27, 2014

(65) Prior Publication Data

US 2014/0253195 A1    Sep. 11, 2014

Related U.S. Application Data

(60) Provisional application No. 61/773,732, filed on Mar. 6, 2013.

(51) Int. Cl.
*H03K 3/017* (2006.01)
*H03K 5/156* (2006.01)

(52) U.S. Cl.
CPC ................... *H03K 5/1565* (2013.01)

(58) Field of Classification Search
CPC .. H03K 5/1565; H03L 7/0814; H04L 7/0332
USPC ....... 327/175, 172–174, 237, 238, 243, 244, 327/245, 147, 158, 159, 160, 141; 375/376
See application file for complete search history.

(56) References Cited

U.S. PATENT DOCUMENTS

| | | | |
|---|---|---|---|
| 7,268,601 B2 | 9/2007 | Kwak | |
| 7,613,266 B1 | 11/2009 | Talbot | |
| 7,681,063 B2 | 3/2010 | Partovi et al. | |
| 8,139,700 B2 | 3/2012 | Beukema et al. | |
| 2007/0271052 A1* | 11/2007 | Abel | H03K 5/1565 702/79 |
| 2011/0001527 A1 | 1/2011 | Lee | |
| 2011/0148498 A1* | 6/2011 | Mosalikanti | H03H 17/08 327/243 |
| 2011/0221495 A1 | 9/2011 | Lee et al. | |
| 2011/0298518 A1 | 12/2011 | Kim et al. | |
| 2012/0038404 A1 | 2/2012 | Yong | |

* cited by examiner

*Primary Examiner* — Lincoln Donovan
*Assistant Examiner* — Thomas Skibinski
(74) *Attorney, Agent, or Firm* — Lowenstein Sandler LLP

(57) ABSTRACT

A Phase Interpolator (PI) may be employed as a precisely-controlled delay element in a transmit path, for example in clock forwarded serial links. Methods and circuits are disclosed for estimating a delay needed to correct duty-cycle/ and or phase errors of the received clock. These corrections or delta values may be transmitted back to the transmitter side, preferably expressed directly in terms of PI phase codes, for convenient adjustment in the transmitter clock circuitry. Various techniques also are disclosed for measuring and mitigating the effects on PI integral non-linearity.

20 Claims, 14 Drawing Sheets

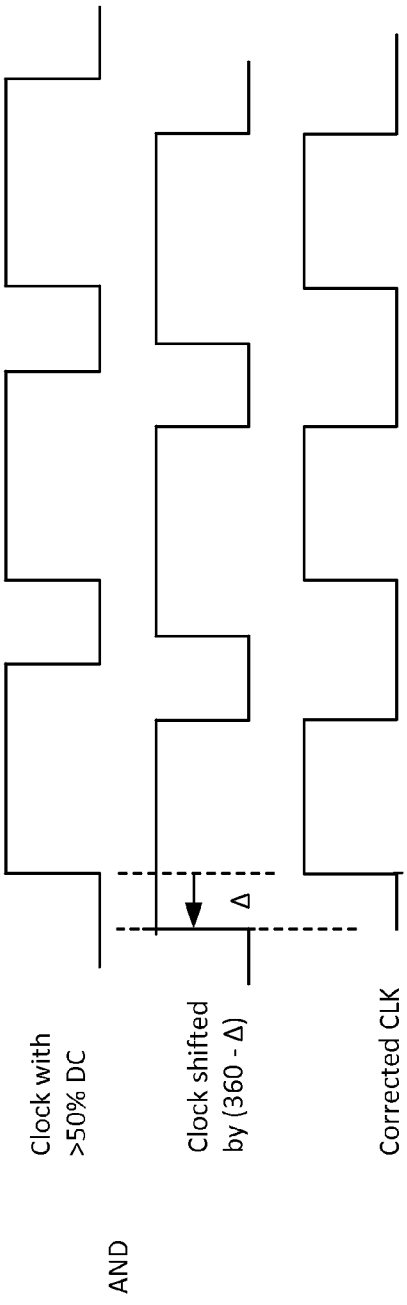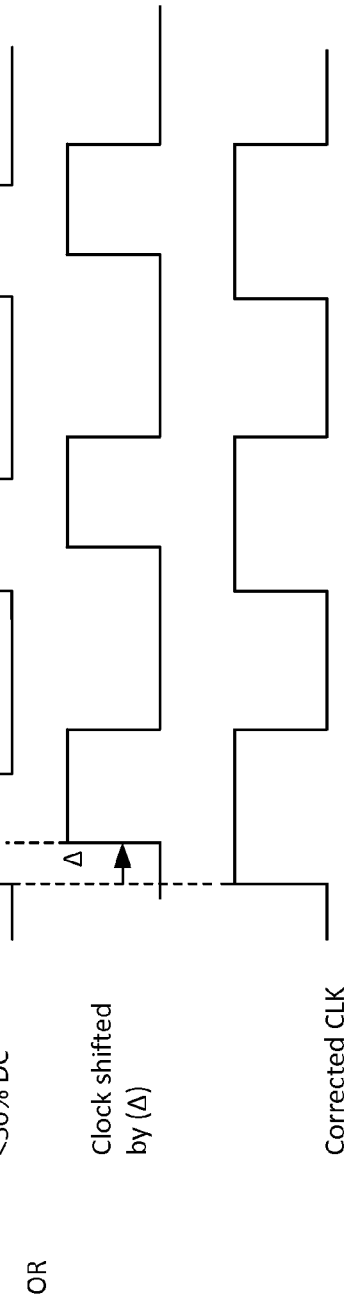

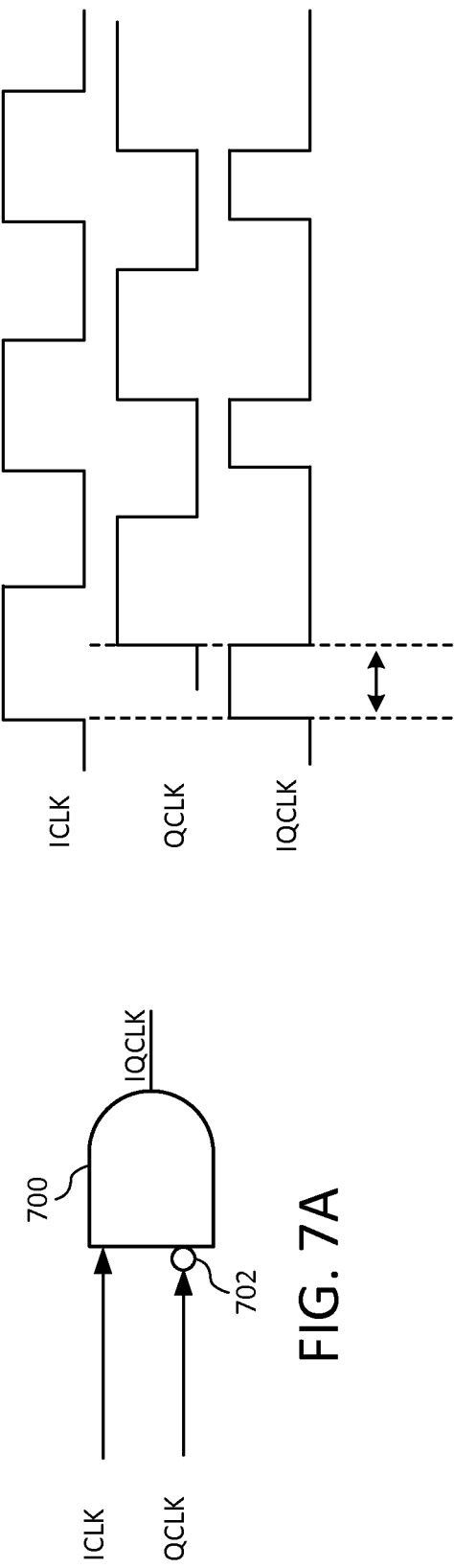

QUADRATURE PHASE ERROR WAVE FORMS

>90° phase difference between ICLK and QCLK → >25% duty-cycle of IQCLK

<90° phase difference between ICLK and QCLK → <25% duty-cycle of IQCLK

OPEN-LOOP CORRECTION OF DUTY-CYCLE ERROR AND QUADRATURE PHASE ERROR

RELATED APPLICATIONS

This application is a non-provisional of U.S. Provisional Application No. 61/773,732 filed Mar. 6, 2013 and incorporated herein in its entirety by this reference.

BACKGROUND OF THE INVENTION

Clock forwarded architectures help to achieve higher data rates due to jitter tracking between transmitted data and the clock signals. Further, higher data rates can be achieved by using quadrature data rate i.e., transmitting data on rising and falling edges of a pair of quadrature clocks e.g., ICLK/QCLK.

In this context, it is important to maintain a desired duty-cycle of the two clock signals, and a desired phase, e.g., a quadrature-phase (90° lag) relationship between them. In some situations, the transmitter-receiver loop traverses two or more devices. For example, control of the duty-cycle and phase shift may be performed in a Memory Controller PHY, while detection of duty-cycle/phase error is performed in the Memory PHY. A precise 50% duty cycle and quadrature-phase relation of the clock signals helps to reduce data recovery error rates and therefore improve effective transmission rates.

BRIEF DESCRIPTION OF THE DRAWINGS

FIG. 5A is a timing diagram illustrating correction of the duty-cycle of a clock signal to 50%, while preserving the rising edge of the clock signal unchanged.

FIG. 5B is another timing diagram illustrating correction of the duty-cycle of a clock signal to 50%, while preserving the rising edge of the clock signal unchanged.

FIG. 7A is a schematic circuit diagram for generating a signal having a duty-cycle that is proportional to a phase difference between two input signals.

FIG. 7B is a timing diagram illustrating operation of the circuit of FIG. 7A.

DETAILED DESCRIPTION OF PREFERRED EMBODIMENTS

This disclosure is not intended to be limited to any particular implementation. Rather, the implementation details discussed below are merely to illustrate the inventive concepts. Aspects of the present disclosure can be utilized, for example, in memory systems, or in any other systems where clock forwarding is employed. In some embodiments, the data transmitter may be in a memory controller, and the corresponding data receiver may be in a corresponding memory. Memory controllers may be standalone or integrated "on-chip," for example in a microprocessor. Here we use the term "memory" in a broad sense to include, without limitation, one or more of various integrated circuits, components, modules, sub-systems, etc. Other aspects of this disclosure relate to assessing and reducing integral non-linearity (INL) in phase interpolator (PI) circuits. These aspects may be used in other contexts not limited to clock-forwarded architectures and applications.

Figure 1:
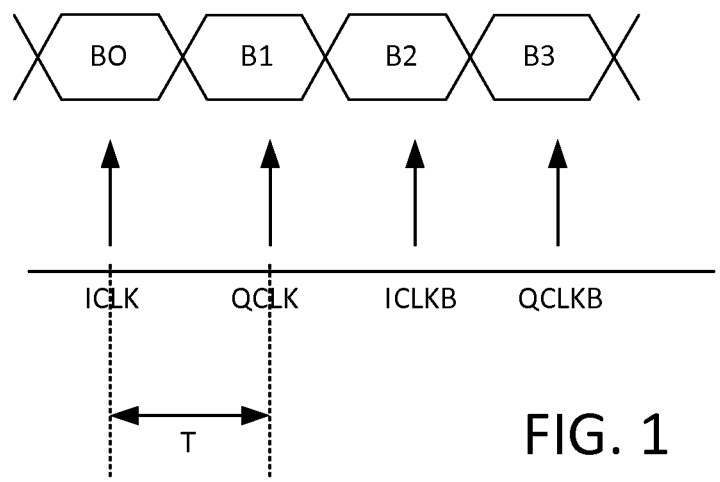
FIG. 1 is a timing diagram illustrating quadrature clock signals and data bit times.
Figure 2:
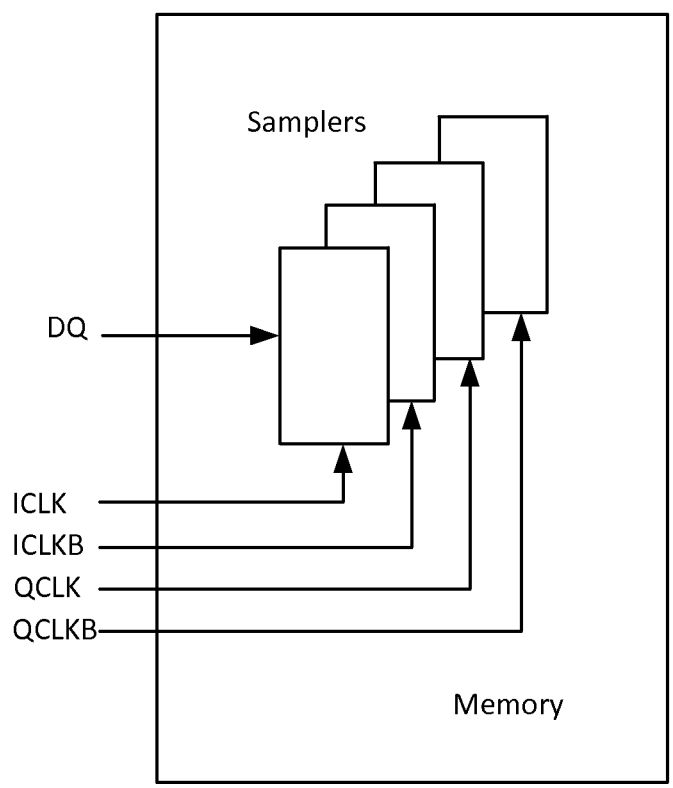
FIG. 2 is a simplified block diagram of serial data sampling circuitry in a memory.

FIG. 1 is a timing diagram illustrating quadrature clock signals. These signals may appear, for example, in the context of a clock-forwarded serial link that implements Quad Data Rate. Here, a controller may send data and two differential clock signals labeled ICLK and QCLK. A memory may sample data on the rising edges of these four clocks, shown in the drawing as bit times B0, B1, B2, and B3. In order to achieve maximum data rate (or minimum errors), the goal is to present equally wide eye openings to the four samplers. That is, each clock signal should correspond to the center of an eye. (A figure of merit, discussed later, may be used as a metric for how far a clock signal is offset from the center of the eye.) To achieve that goal requires that the rising edges of the four clock signals be equally spaced apart. FIG. 2 illustrates one arrangement in which the four clock signals are input to four data samplers, respectively. All of the samplers receive the same serial data input DQ.

Equal spacing of all four clock signal edges requires:
ICLK rising edge to QCLK rising edge time T=90 phase lag
ICLK rising edge to ICLKB rising edge time T=50% duty-cycle
QCLK rising edge to QCLKB rising edge time T=50% duty-cycle And these criteria must be met at the receiver side, where the samplers are located.

Figure 3:
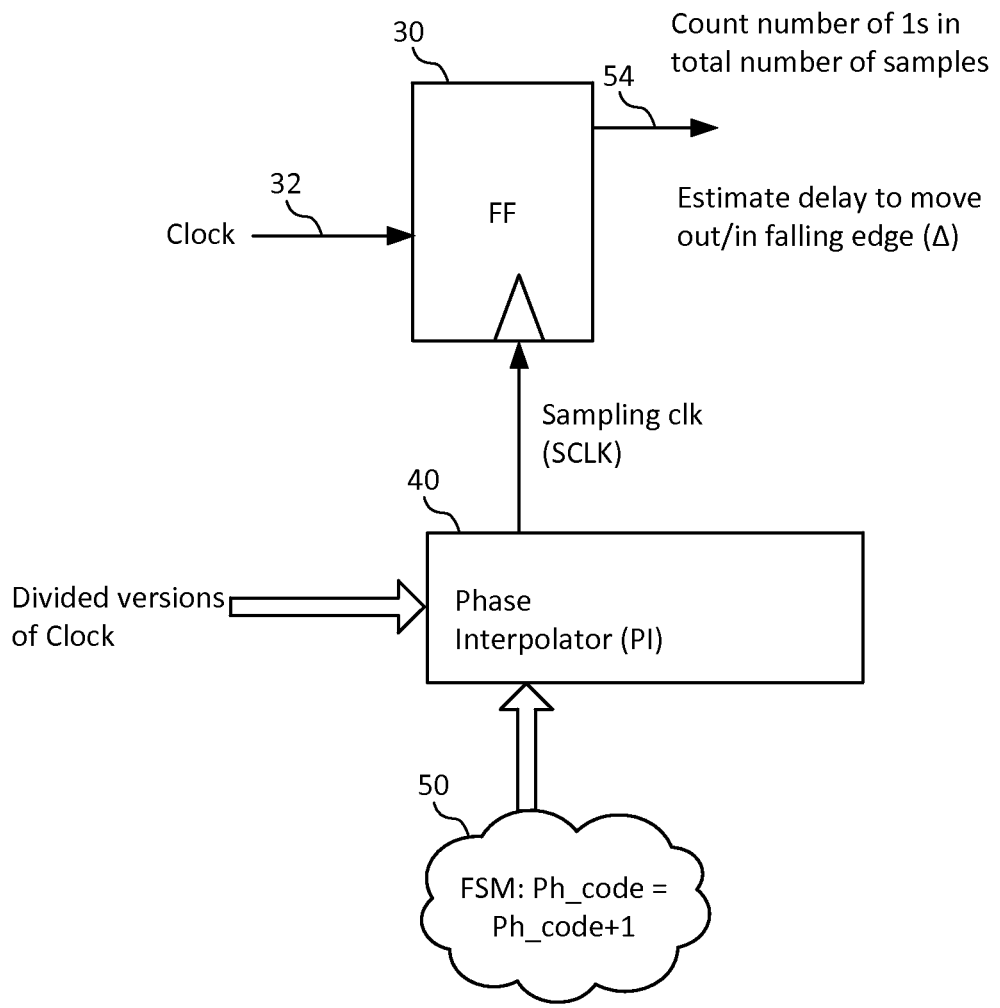
FIG. 3 is a simplified block diagram of a circuit to measure duty-cycle of a clock signal using a phase interpolator.

One step toward meeting these criteria calls for measuring duty cycle of the clock signals. FIG. 3 is a simplified block diagram of a circuit to measure duty-cycle of a clock signal using a phase interpolator. Here, a clock signal under test 32 is input to a flip-flop circuit 30. Divided or normal versions of the clock signal are input to a phase interpolator circuit (PI) 40. A source to provide phase codes to the PI, for example a counter, finite state machine (FSM 50), or the like, is provided. The FSM or other source is arranged to count over the phase code input range of the corresponding PI. In other words, depending on the resolution of the PI, the FSM may count over 0-63 (6 bits) or 0-255 (8 bits), for example. These parameters are merely illustrative and are not critical. In some embodiments, only a modest number of samples are needed, say 32 or 64.

The output of the PI is referred to as a sampling clock signal (SCLK) in the drawing, as it is used to sample the state of the clock signal under test 32. Each cycle of the SCLK clocks or triggers the flip-flop 30 to output at node 54 the current state of its clock input 32. The PI shifts the falling edge of its input clock signal responsive to the current phase code input from source 50. A counter or the like (not shown) counts the number of 1s in the samples at node 54. This number is compared to the total number of samples (cycles of SCLK) to provide an indication of the duty-cycle of the input clock signal. For example, if 120 "1s" are counted out of a total of 200 cycles, the duty-cycle of the clock signal waveform may be estimated to be 120/200=60%.

In use, a circuit of the type illustrated in FIG. 3 may be used to determine a phase code value for input to the PI at which a 50% duty-cycle is measured for the input clock 32. In this way, the phase code provides an indication of an amount of delay to adjust (in or out) a falling edge of the input clock signal to achieve 50% or any other desired duty-cycle. This adjustment in phase code we will call delta ($\Delta$). Accordingly, in a preferred embodiment, the unit for delta will be the PI phase code unit.

Figure 4:
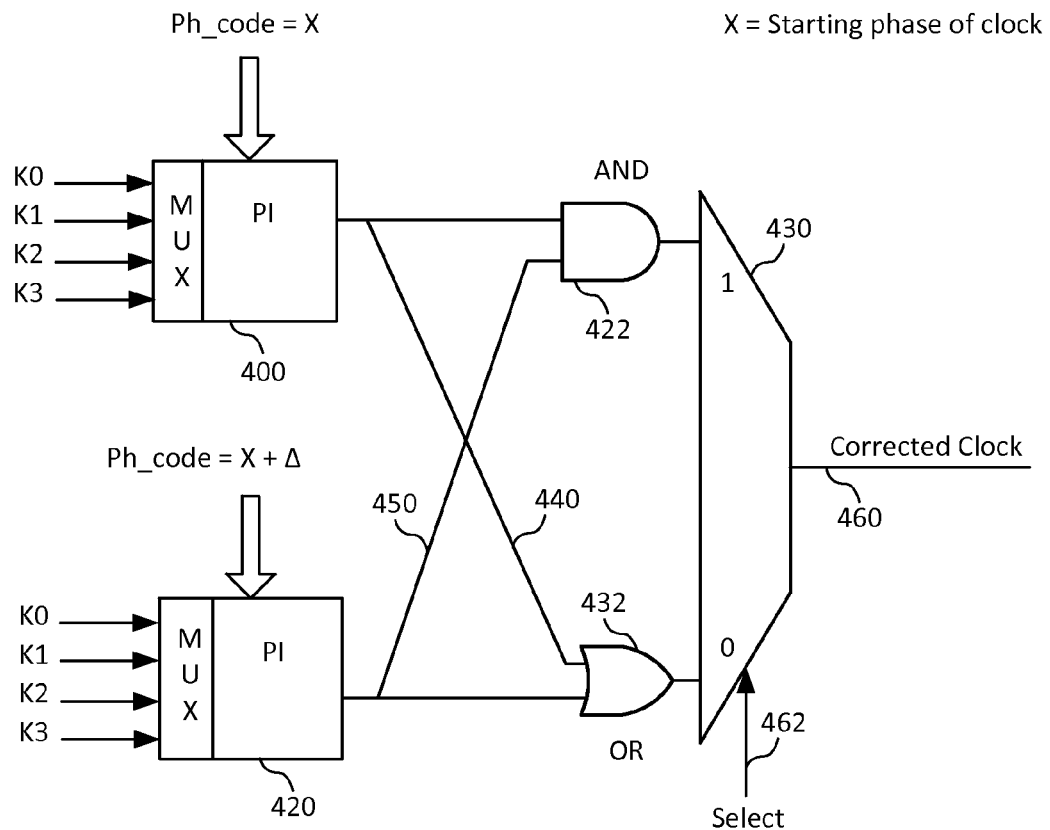
FIG. 4 is a simplified block diagram of a circuit to adjust a duty-cycle of a clock signal using phase interpolators.

FIG. 4 is a simplified block diagram of a circuit to adjust a duty-cycle of a clock signal. Referring to FIG. 4, clock input K lines K0-K3 are input to a first PI 400. The PI 400, driven by a phase code input (PH_code=X) generates a first clock signal at node 440. The same K lines are input to a second PI 420. The second PI 420, driven by a second phase code input (PH_code=X+$\Delta$) generates a second clock signal at node 450. Accordingly, the second clock signal 450 is offset from the first clock signal 440 by $\Delta$. As explained above, the phase code adjustment $\Delta$ may be provided by a duty cycle measurement circuit such as a illustrated in FIG. 3. The first and second clock signals 440, 450 are input to an OR gate 432. The first and second clock signals 440, 450 are also input to an AND gate 422. The OR gate 432 output is coupled to a first input (0) of a multiplexer 430, while the AND gate output is coupled to a second input (1) of the multiplexer 430.

The mux 430 outputs a corrected clock signal at node 460, responsive to a select input at 462. If the duty cycle of the uncorrected clock is greater than 50%, a select signal at node 462 is input to the multiplexer 430 to select input number 1. Alternatively, if the duty cycle of the uncorrected clock is less than 50%, the select signal at 462 is set to select the 0 input to the multiplexer. Using this arrangement, the corrected clock signal at node 460 will have a following edge adjusted by $\Delta$ phase code counts relative to the input clock signal, to arrive at 50% duty cycle. The circuitry of FIG. 4 is merely illustrative and equivalent circuits may be used.

FIG. 5A is a timing diagram illustrating correction of the duty cycle of a clock signal having >50% duty cycle, while preserving the rising edge of the clock signal unchanged. In other embodiments, a falling edge can be preserved. The corrected clock signal in the figure has the desired 50% duty cycle. In this case, the corrected clock signal is shifted by (360-$\Delta$). The corrected signal is selected from the AND gate 422 (FIG. 4).

FIG. 5B is a timing diagram illustrating correction of the duty cycle of a clock signal having <50% duty cycle, again while preserving the rising edge of the clock signal unchanged. In this case, the following edge is shifted by $\Delta$, as shown, by selecting the corrected clock signal generated by the OR gate 432 (FIG. 4). Again, the corrected clock cycle FIG. 5B exhibits a desire 50% duty cycle.

Figure 6:
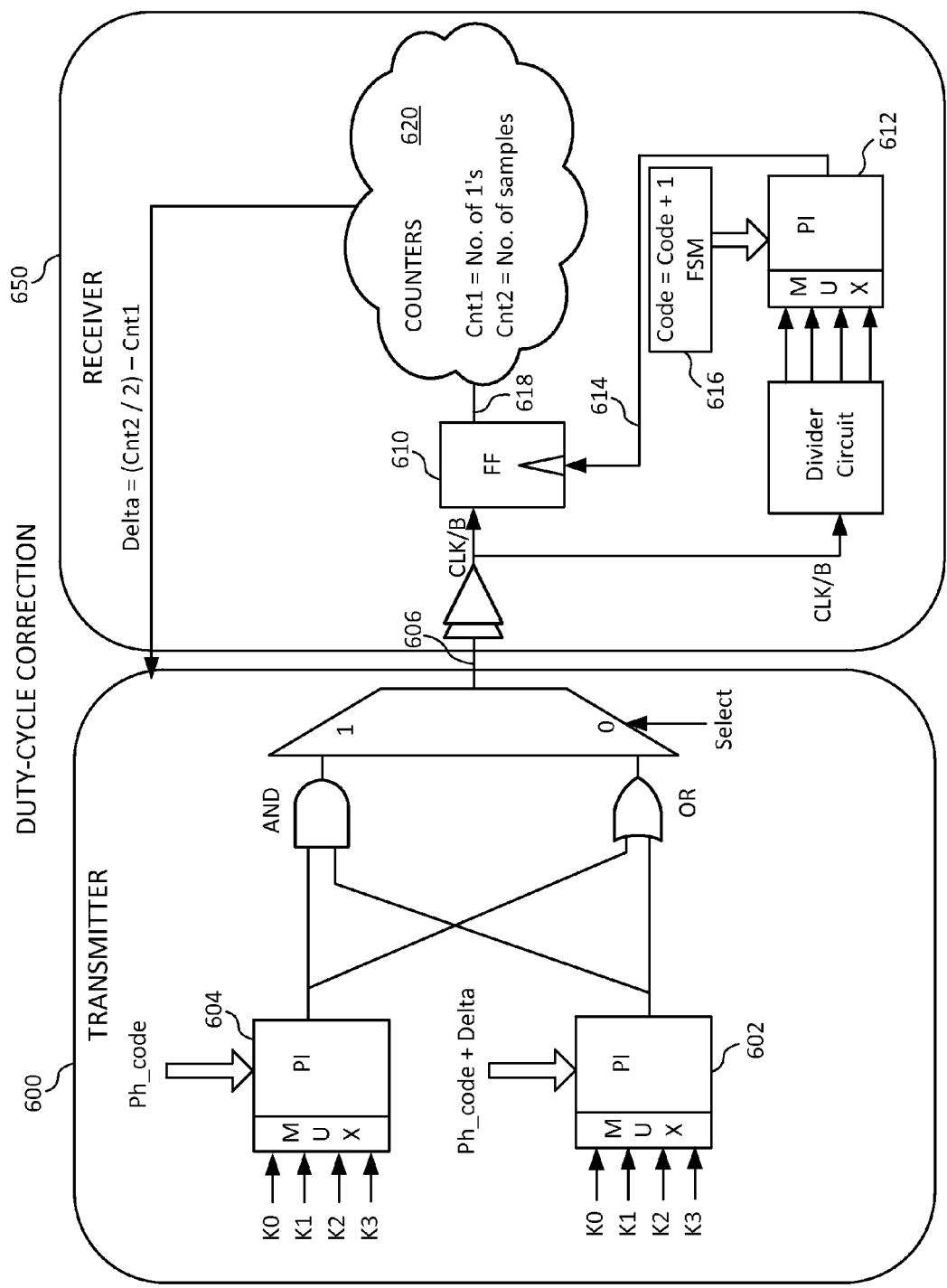
FIG. 6 is a simplified block diagram of an example of clock circuitry in a transmitter and a receiver to realize open-loop duty-cycle correction of clock signals.

FIG. 6 is an illustrative schematic diagram of an example of clock circuitry, arranged so as to realize 50% duty cycle of the clock signal at the receiver end with a single correction. Referring to FIG. 6, circuitry on the left side represents a transmitter side 600 of a clock forwarded the serial link. The circuitry in a transmitter side 600 is similar to that of FIG. 4 so the particulars will not be repeated here. Briefly, a pair of PIs 602, 604 is used to generate a corrected clock signal at node 606. Circuitry on the right side of the drawing represents a receiver side 650 of the serial link. The corrected clock signal 606 from the transmitter by The circuitry illustrated on the receiver side 650 is similar to that described earlier with regard to FIG. 3, for measuring the duty cycle of a received clock signal.

This diagram illustrates how the duty cycle of the received clock signal 606 may be measured in order to determine a duty cycle correction or Delta, preferably expressed in terms of PI phase code counts. The correction or Delta ($\Delta$) may be transmitted back to the transmitter side 600, as illustrated, to be applied to the phase interpolator 602 in order to adjust the clock signal so that it will have a 50% duty cycle at the receiver side 650. As explained above, the received clock signal is input (/4) to a PI 612 to generate sample clock signals at node 614. The PI 612 is controlled by FSM 616 which is arranged to step though the range of phase codes (Code=Code+1) so that each sample clock signal at 614 has a phase corresponding to the current state of the FSM. The sample clock signal is applied to the clock input of a flip flop circuit 610 (D-type), to clock the input clock signal CLK/B to the FF output at node 618. Counters 620 are arranged to count the number of 1's at node 618 ("Ct1") along with the number of samples ("Cnt2"), based on the sample clock signal 614. If the total number of samples divided by 2 equals the number of 1's, then the clock signal CLK/B has a 50% duty cycle. The error or offset from 50%, Delta=(Cnt2/2)−Cnt1. This metric is fed back to the transmitter side 600 to adjust PI 602.

In a preferred embodiment, the correction or Delta may be expressed in units of the phase interpolator input code or phase code. Preferably, the phase interpolator 612 which is used in the receiver circuitry 650 to measure the duty cycle error is matched to the phase interpolators 602 and 604 in the transmitter side circuitry 600, such that the phase code adjustment or Delta I will have the same step size. In general, circuitry of the type disclosed can be used to estimate a delay for adjusting a received clock signal to achieve any desired duty cycle. The phase adjustment can be done as a single adjustment, as distinguished from an incremental or closed loop feedback system.

In some embodiments, the received clock signal may comprise quadrature clock signals, I clock (ICLK) and Q clock (QCLK). The described circuits and methodology can be applied to at least one of the quadrature clock signals. In some embodiments, the desired duty cycle maybe 50% for I clock and also 50% for Q clock so as to support quad data rate sampling. In some embodiments, the clock signal delay is applied for adjusting only the following edge of at least one of the quadrature clock signals so as to maintain alignment of the rising edges. Conversely, in other embodiments, the delay may be applied to a rising edge while maintaining alignment of the falling edges of the clock signals.

FIG. 7A shows a schematic diagram of an example of circuitry for generating a signal that has a duty cycle that is proportional to a phase difference between two input signals. Various other logic circuits may be used may be used to provide the same function. In FIG. 7A, input signal ICLK is input to an AND gate 700 and QCLK clock signal is input to the other input to the AND gate 700 through an inverter 702. The output in this case is labeled IQCLK for reference. The Boolean function thus is ICLK AND NOT QCLK. FIG. 7B is a timing diagram that illustrates operation of the circuit of FIG. 7A, in the case that there is less than 90° phase difference between the input signals ICLK and QCLK. Where there is a 90° phase difference between the input signals, the output signal IQCLK exhibits a 25% duty cycle as shown in FIG. 7B.

Figure 8A:
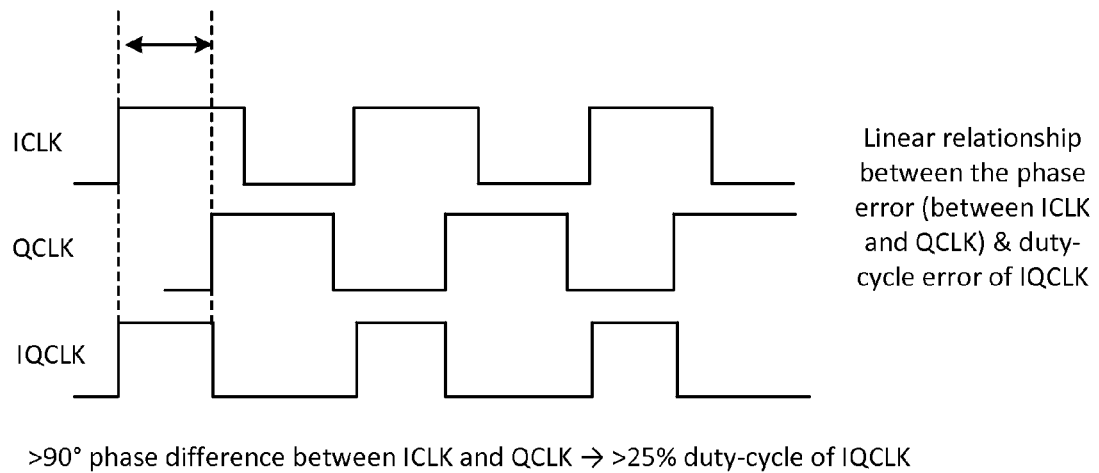
FIG. 8A is a timing diagram illustrating operation of the circuit of FIG. 7A, where there is a >90 degree phase difference between the two input signals.
Figure 8B:
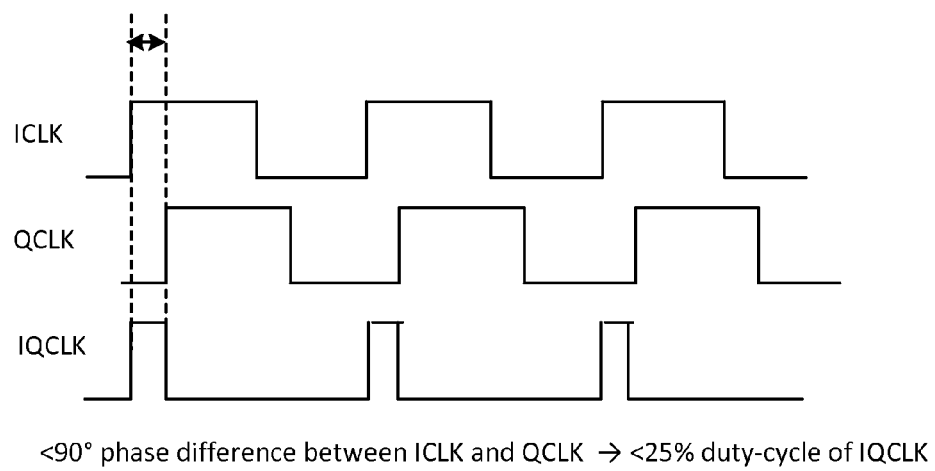
FIG. 8B is a timing diagram illustrating operation of the circuit of FIG. 7A, where there is a <90 degree phase difference between the two input signals.

FIG. 8A is another time timing diagram illustrating operation of a circuit of the type shown in FIG. 7A. Here, there is a greater than 90° phase difference between ICLK and QCLK, with a resulting duty cycle of >25% of IQCLK. The circuit exhibits a linear relationship between the phase error (between ICLK and QCLK) and the duty cycle of IQCLK, i.e., the offset from 25%. FIG. 8B illustrates the case where there is a <90° phase difference between ICLK and QCLK, with a resulting duty cycle of <25% of IQCLK.

Figure 9:
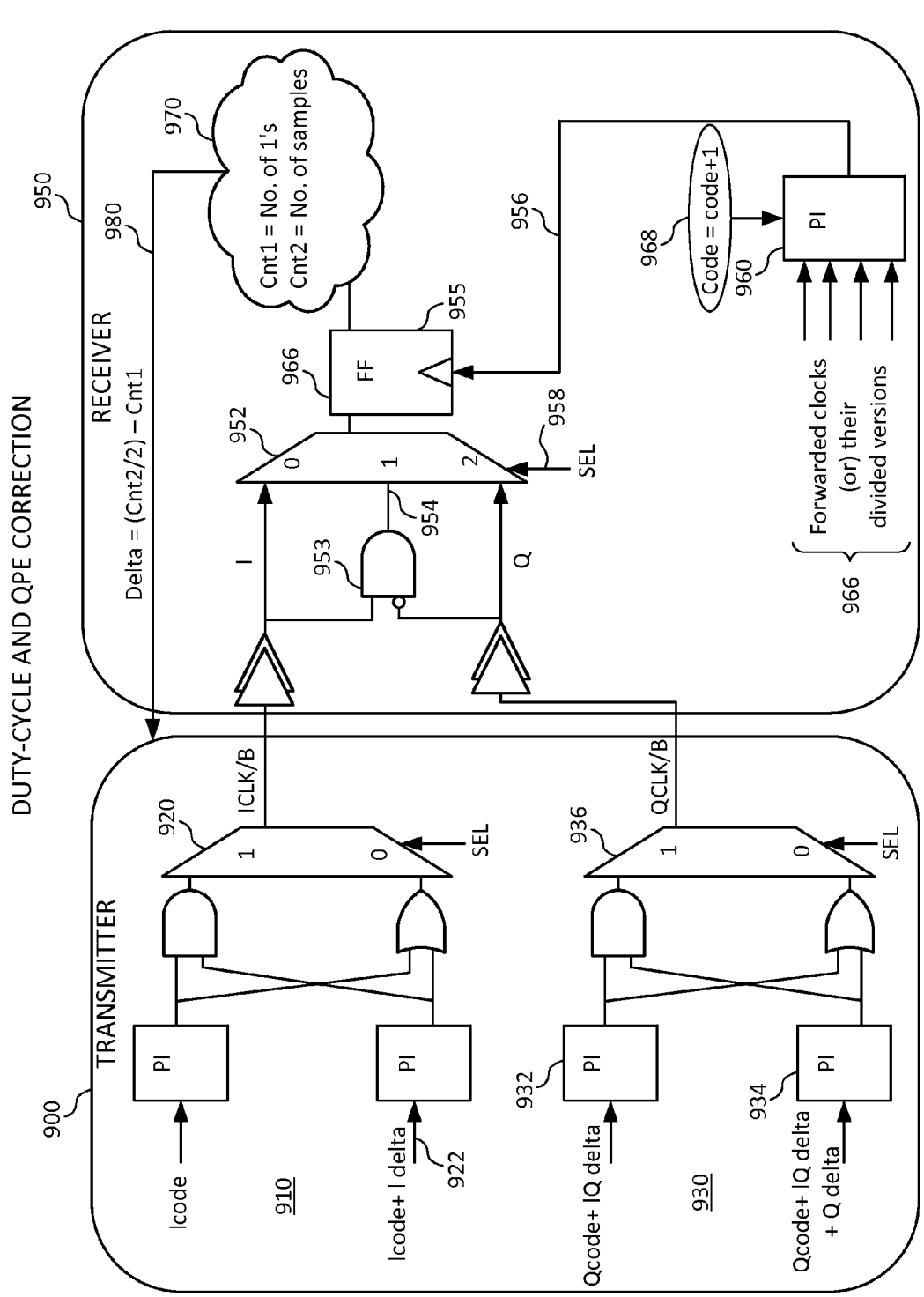
FIG. 9 is a simplified block diagram of an example of clock circuitry in a transmitter and a receiver to realize open-loop duty-cycle and quadrature phase error (QPE) correction of clock signals.

FIG. 9 is a simplified block diagram of an example of clock circuitry in a transmitter and receiver, arranged to realize both duty cycle and quadrature phase error (QPE) correction of clock signals. Circuitry of the type illustrated in FIG. 9 may be implemented, in some embodiments, in transmitter and receiver circuitry of a clock forwarded serial link. Serial links are useful for many data transfer applications, including without limitation memory systems and devices.

Referring again to FIG. 9, the transmitter circuitry 900 includes a first portion 910 arranged to generate a corrected clock signal ICLK/B at the output of multiplexer 920. Similarly, a second portion 930 is arranged to generate a corrected clock signal QCLK/B at the output of multiplexer 934. These correction circuits 910, 930 utilize pairs of PIs as described above with regard to FIG. 6 for duty cycle correction. In the case of the ICLK, the correction circuitry 910 utilizes a correction "I delta" to the PI code, node 922 on the transmitter side.

The QCLK correction circuitry 930 also may utilize a pair of PIs. A first PI 932 is controlled by phase code input=Qcode+IQ delta, while the second PI 934 receives phase code input=Qcode+IQ delta+Q delta. Operation of adjustment circuits of this general type was described in greater detail with regard to FIG. 4. In this case, the correction I delta may be used to adjust ICLK/B to a desired duty cycle such as 50%. In the case of QCLK/B each PI 932, 934 receives Qcode+IQ delta, to adjust for quadrature phase error (QPE), where IQ delta is used to correct for phase quadrature relationship of the signals. In addition, the second PI 934 enables adjusting the QPE corrected signal to 50% duty cycle. All three error signals, I delta, Q delta and IQ delta are received from the receiver side circuitry 950 as described next.

Referring now to the receiver side 950 in FIG. 9, the received signal ICLK is input to input 0 to a multiplexer 952. The received quadrature clock signal QCLK is input to input 2 to the multiplexer 952. The ICLK and QCLK/signals are input to an AND gate 953 to produce an IQCLK signal at node 954, representing a quadrature phase error. As explained above with regard to FIG. 7A, the signal IQCLK has a duty cycle linearly proportional to the QPE of ICLK and QCLK. In an embodiment, the QPE signal has a 25% duty cycle for a 90% phase difference between ICLK and QCLK. The phase error signal IQCLK is input to input 1 of the multiplexer 952. The multiplexer inputs are selected by a select signal at node 958.

In an embodiment, the forwarded clocks (or their divided versions) 966 are input to a PI 960. The PI 960 is controlled by an FSM or other counter source, not shown, to provide and increment phase codes 968. The output from the PI 960 is coupled via node 956 to a clock input of flip-flop (FF) 966. The flip-flop couples a signal currently selected by multiplexer 952 (one of the three signals described above) to one or more counters represented by cloud 970. Circuitry of this type, arranged to measure duty cycle of an input clock signal, was described above with regard to FIG. 6. In this embodiment (FIG. 9), by means of the 3-input multiplexer 952, the same circuitry can be used to measure duty cycle of any or all of ICLK, QCLK or IQCLK, where the last one is representative of QPE. The resulting measurements, which provide estimates of errors in the clock signals, preferably are expressed in units of phase code adjustment or delta (Δ). These phase code adjustments, I delta, Q delta and IQ delta, respectively, are transmitted back to the transmitter side 900, for example via path 980. Many different known techniques can be used to transmit that data.

Figure 10A:
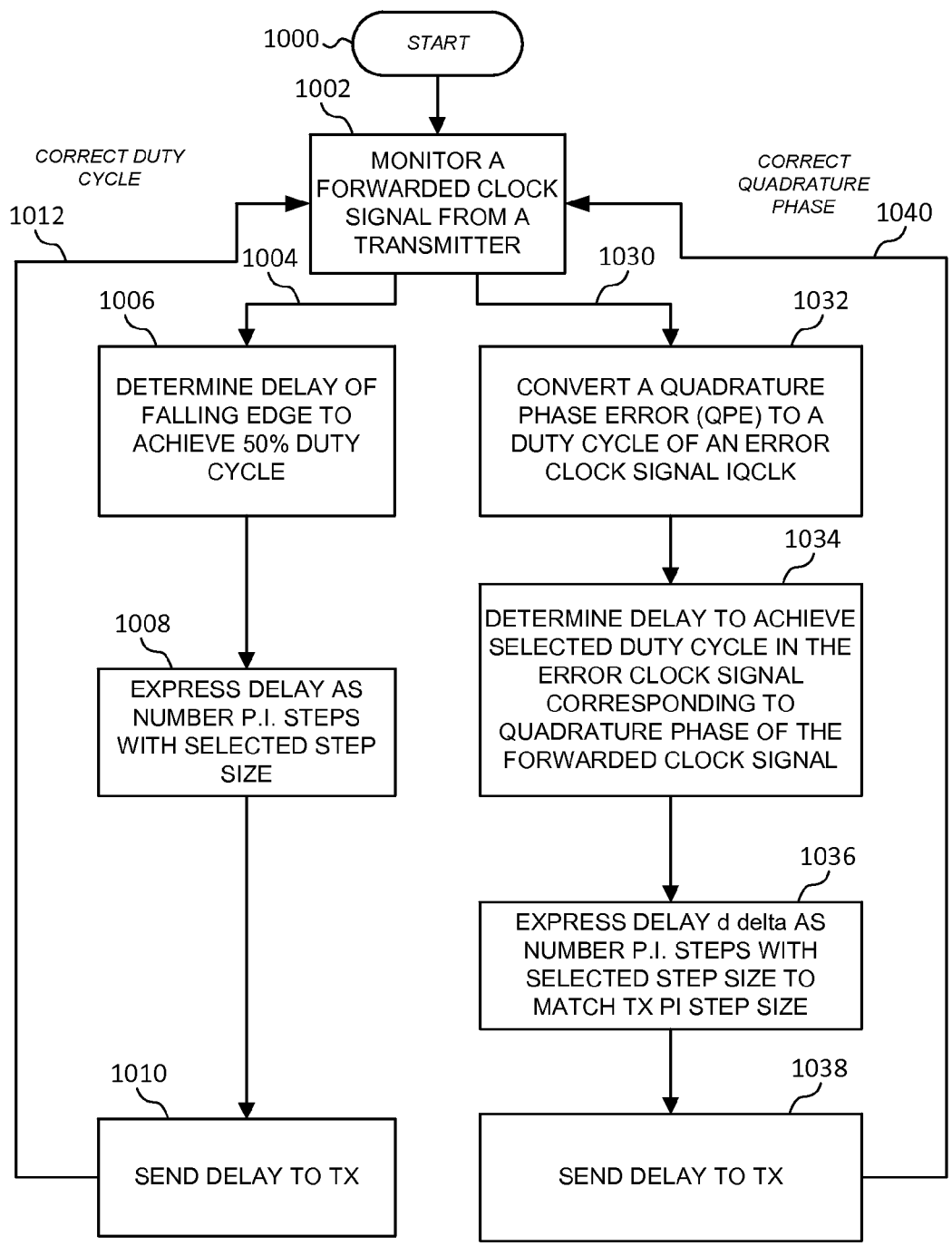
FIG. 10A is a logic flow diagram illustrating methods for open-loop duty-cycle and quadrature phase error (QPE) correction of clock signals.

FIG. 10A is a logic flow diagram illustrating methods for open-loop duty-cycle and quadrature phase error (QPE) correction of clock signals. The diagram begins at the start node 1000. The process monitors a forwarded clock signal received from a transmitter at block 1002. From there, it can proceed to correct duty cycle of the forwarded clock signal, or to correct quadrature phase of the forwarded clock signal. At path 1004, assuming duty cycle correction is selected, the method proceeds to block 1006 for determining a delay of the falling edge to achieve a desired (typically 50%) duty cycle at the receiver. Next, in block 1008, the delay is preferably expressed as a number of phase interpolator steps (or phase code steps) with a selected step size. Proceeding to block 1010, the delay estimate is transmitted back to the transmitter via path 1012.

The quadrature phase portion in this embodiment begins at block 1030. Here, the process calls for converting a quadrature phase error (QPE) to a duty cycle of an error clock signal IQCLK. At block 1034, the process continues to determining the delay necessary to achieve a selected duty cycle in the error clock signal corresponding to a quadrature phase of the forwarded clock signal. Continuing to block 1036, the delay is expressed as a delta (Δ) i.e., a number of phase interpolator steps of a step size selected to match the transmitter side phase interpolator step size. Finally, at block 1038, the determined delay is sent back to the transmitter side via path 1040. THE duty cycle correction and or the QPE correction can be performed at various times. For example, they may be done at power up, at reset, or periodically, or responsive to predetermined conditions as described below. These examples are merely illustrative and not intended to be limiting.

Figure 10B:
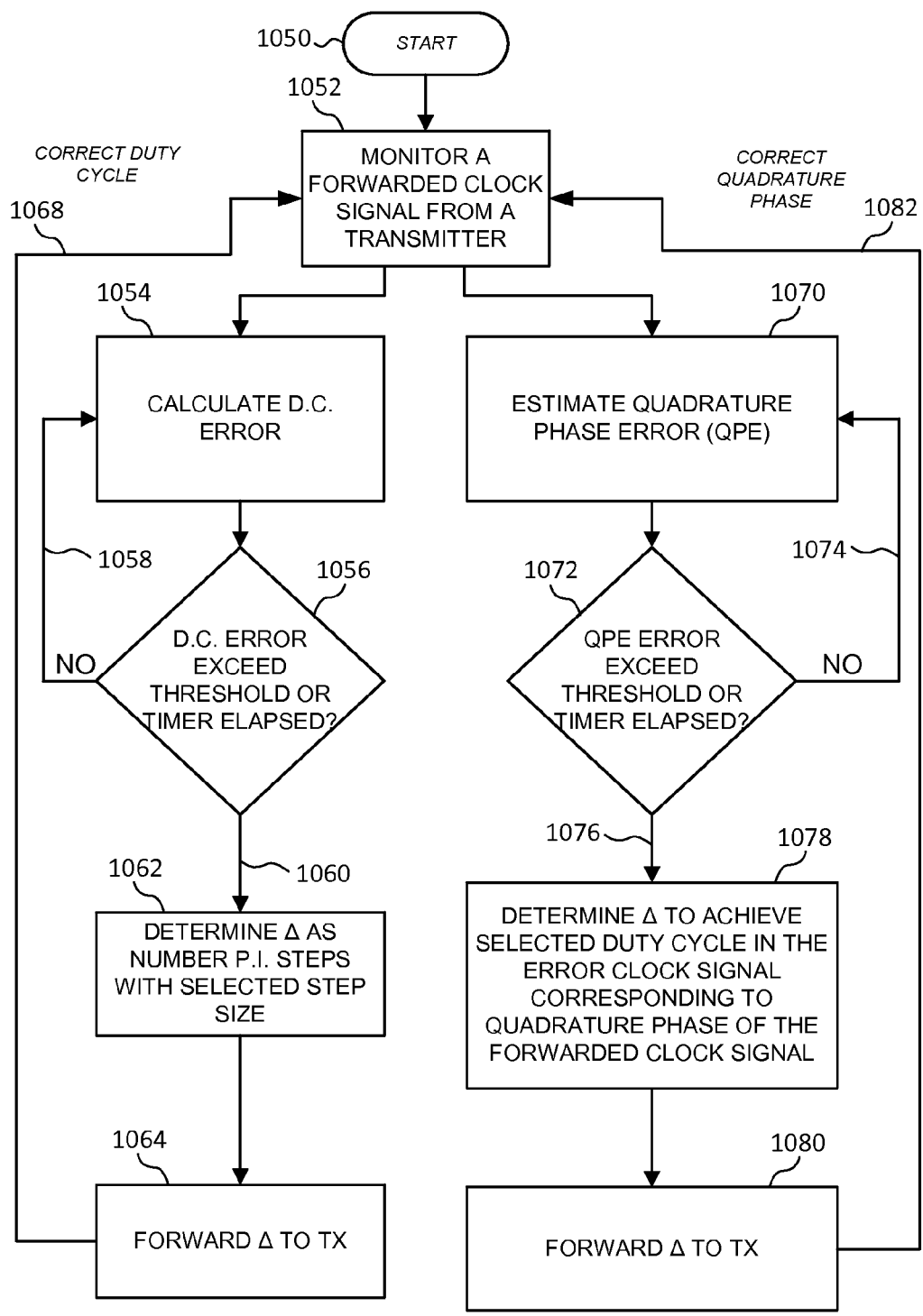
FIG. 10B is a logic flow diagram illustrating methods for threshold or timer driven duty-cycle and quadrature phase error (QPE) correction of clock signals.

Referring now to FIG. 10B, this process begins at step 1050. It proceeds with monitoring a forwarded clock signal from a transmitter, block 1052. Next, at block 1054, the process calculates a duty cycle error, as described previously in greater detail. Proceeding next to decision 1056, the question is whether the estimated duty cycle error exceeds a predetermined threshold value, or a timer has elapsed. These are two examples of criteria that may be useful in some embodiments for determining when to conduct an error adjustment. If neither of these conditions is satisfied, the process loops back via 1058 to repeat step 1054. This loop continues, repeatedly calculating or estimating the duty cycle error, until one of the mentioned conditions is met. If and when either condition is met, the process falls down via path 1062 block 1062. Here, the process determines the correction value Δ, preferably expressed as a number of phase interpolator steps having a selected step size. Next, at block 1064, the determined correction or Δ is forwarded to the transmitter. Then the process loops back of via path 1068 to the block 1052 in order to repeat the process. However, a single measurement and correction ("open loop") is preferred in some embodiments. This approach avoids repeated PHY control register accesses in some applications. That said, because the process is fast and requires minimal processing, it allows for periodic corrections while imposing very little overhead. Further, in a preferred embodiment, the implementation is digital and therefore has a relatively low cost of implementation.

At block 1070, the process calls for estimating a quadrature phase error. Proceeding to decision 1072, the question is whether the phase quadrature error exceeds a predetermined threshold value, or whether a timer has elapsed. Either or both conditions can be implemented. If neither applicable condition is satisfied, the process loops back via path 1074 to repeat the quadrature phase error estimation at block 1070. If and when the predetermined condition is satisfied, the process falls out of the loop via path 1076 to block 1078. Here, the process calls for determining or estimating an error or Δ necessary to achieve a selected duty cycle in the error clock signal, corresponding to the quadrature phase of the forwarded clock signal. In other words, what change in the duty cycle of the error signal is necessary to adjust the quadrature phase of the forwarded clock signal to achieve the desired 90° in most cases. Next, the method continues to block 1080 whereupon the determined error correction or Δ is forwarded back to the transmitter, via path 1082. This correction corresponds to the quantity "IQ delta" input to the PI 934 in the example of FIG. 9. Returning to the initial block 1052, the process may be repeated.

Figure 13:
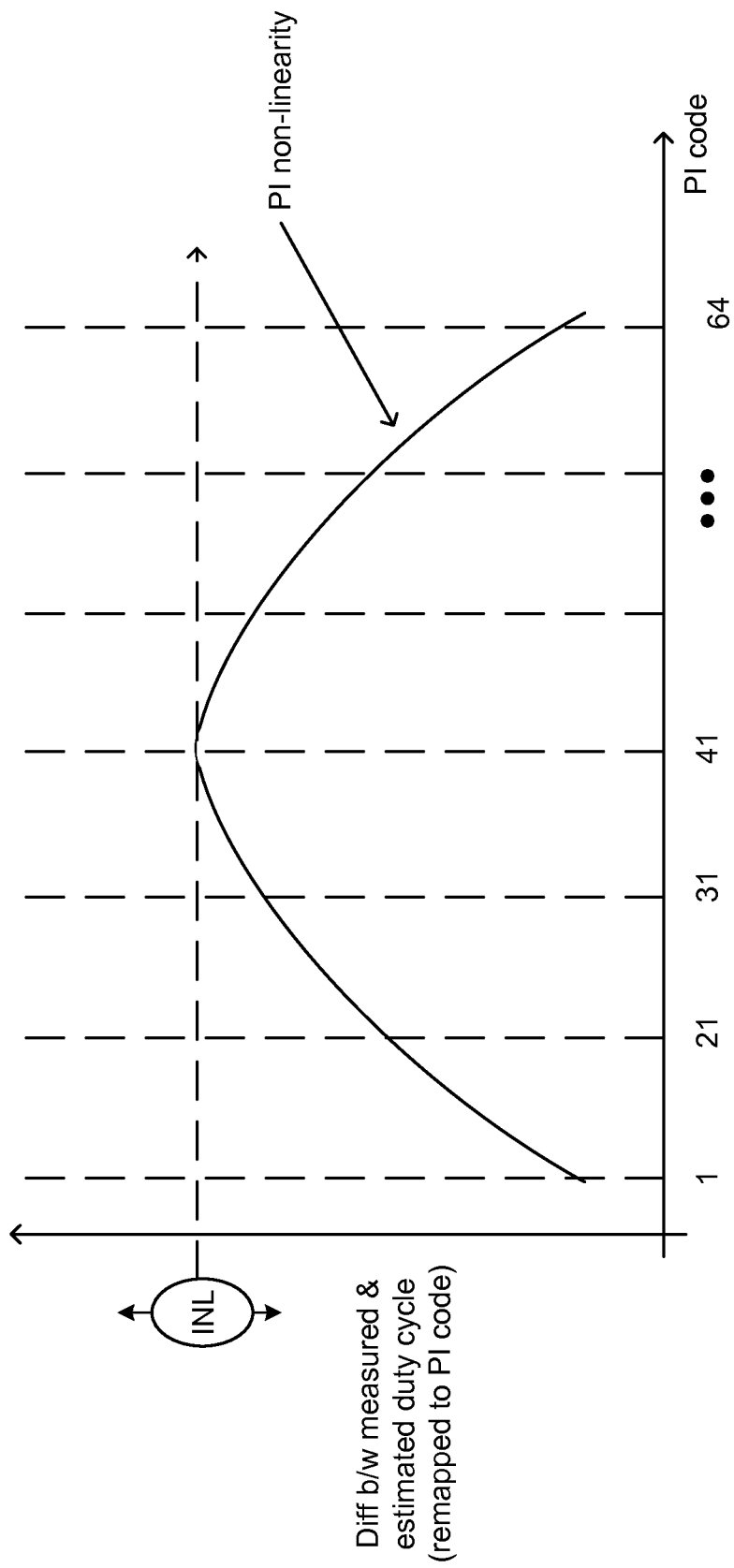
FIG. 13 is a graph illustrating an example of PI non-linearity in which duty cycle error due to non-linearity is mapped to PI code.

Like all devices, PIs are not perfect. In general, due to circuit fabrication variations, for example, PIs exhibit some integral non-linearity ("INL"). This property may be represented graphically an INL curve. An example is shown in FIG. 13, discussed in more detail later. Duty cycle correction, and QPE correction, using the techniques discussed above, may incur measurement errors as a result of INL. More specifically, error corrections will be compromised where the PI used for measurement, say in a receiver, does not have exactly the same INL curve as the PI generating the clock signals on the transmitter side, even though they may have the same nominal phase code step size.

Figure 11:
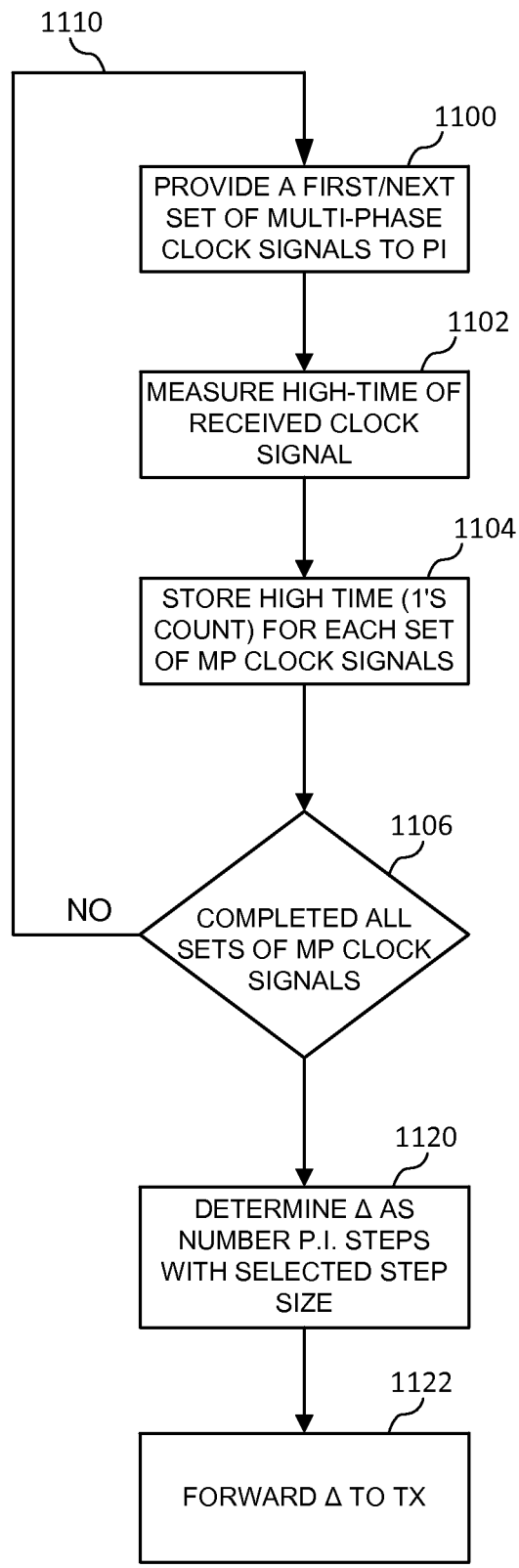
FIG. 11 is a flow diagram illustrating applying multiple sets of K-lines to mitigate integral non-linearity (INL) of a phase interpolator in connection with measuring a received clock signal.

One way to mitigate the effect of INL is illustrated in the flow diagram of FIG. 11. In the figure, the process calls for generating multiple sets of K-lines (or rotating the existing K-lines through 360 degrees), block 1100, for input to a PI. In an embodiment, four K-lines may be used per set. The sets of K-lines are selected to drive the PI at various different locations on the INL curve. For example, one set may be generated by dividing ICLK by four, a second set may be generated by dividing QCLK by four, a third set may be generated by dividing ICLKB by four, and a fourth set may be generated by dividing QCLKB by four.

Referring again to FIG. 11, block 1100 describes this process of providing sets of K-lines. At block 1102, the system measures a high time of the received clock signal. The high time (ones count) for each set of multi-phase clock signals is stored, block 1104. (This refers to a process for estimating actual duty cycle, as explained above with regard to FIG. 3.) Continuing at decision 1106, the question is whether the process has completed for all sets of multi-phase clock signals. For example, four sets may be used. If not, the process loops via path 1110 back to block 1100 to input the next set of multiphase clock signals to the phase interpolator. This loop continues until all of the sets of K-lines, for example 4 sets, have been completed and the corresponding measurements stored. Next, at block 1120, these stored values are averaged to determine an average correction value or Delta. And finally, this average Delta is forwarded to the transmitter side 1122. By driving the PI at various different locations on the INL curve, and averaging the output duty cycles, the non-linearity effect is reduced.

Estimating and Reducing Phase Interpolator Non-Linearity

We have found that CDR (clock data recovery) jitter is a major contributor to overall receiver jitter. We have also determined that CDR dither can be reduced by minimizing PI INL. Above, we mitigated INL effects by averaging over different parts of the INL curve. Next, we discuss ways to measure (actually quantify) INL and how to correct or reduce INL effects using that information in several ways. It should be noted that correcting or minimizing PI INL, as described herein, may be useful in some clock forwarded serial link applications. However, these aspects of the disclosure are not limited to serial link applications. Estimating and reducing PI INL is useful for PIs in general.

Figure 12:
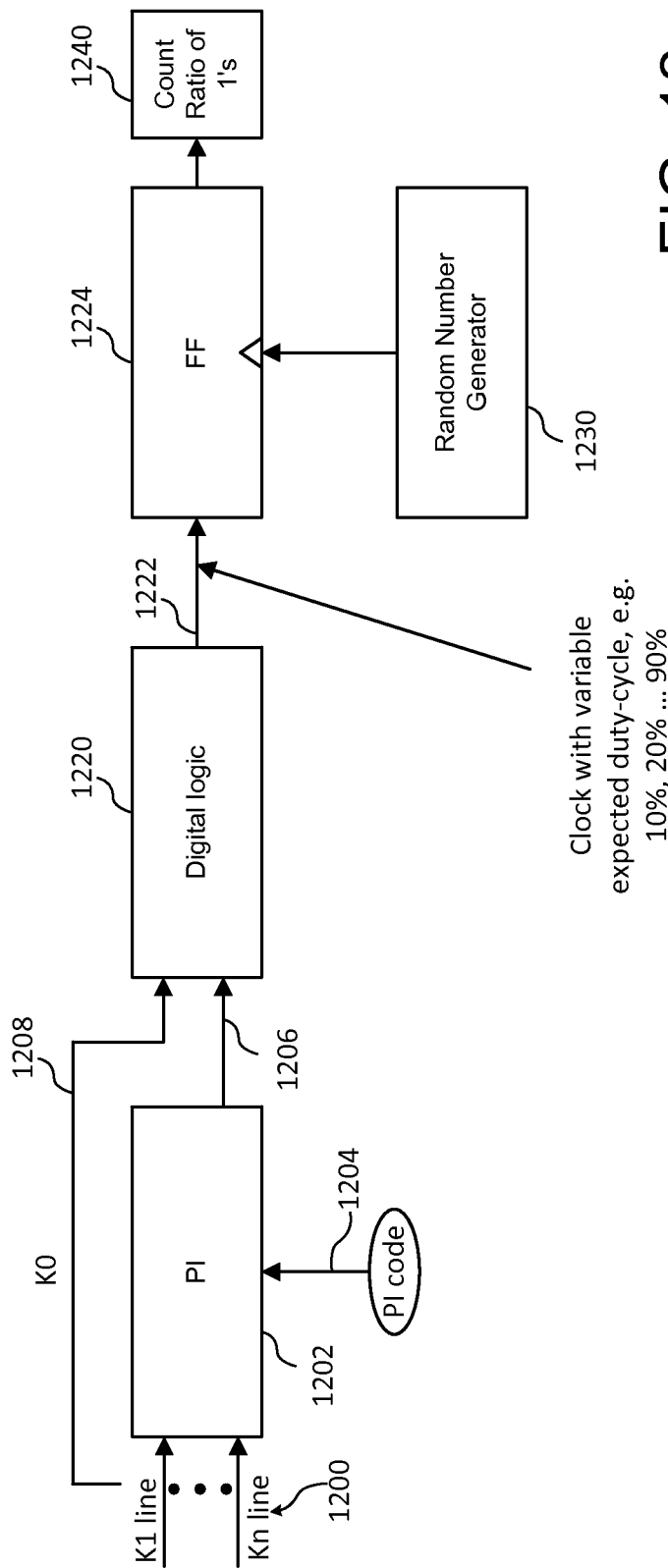
FIG. 12 is a simplified circuit diagram illustrating a method for assessing INL of a PI from a clock duty cycle measurement.

First, we can estimate PI INL, in one embodiment as follows. FIG. 12 is a simplified circuit diagram illustrating a method for assessing INL of a PI by leveraging a clock duty cycle measurement technique. In FIG. 12, a set of K lines 1200 is input to a phase interpolator circuit 1202. The phase interpolator 1202 receives a PI code at node 1204. The code is selected to give any desired duty cycle. The phase interpolator 1202 accordingly generates an output clock signal at node 1206. The clock signal at node 1206 is input to a digital logic block 1220. In addition, the initial clock signal K0 is input via path 1208 to the digital logic block 1220. These 2 clock signals are combined with digital logic comprising and/or gates to generate a clock output signal at node 1222. The clock signal at node 1222 will exhibit an expected duty cycle responsive to the PI code input at 1204.

This clock signal 1222 is input to a flip-flop circuit 1224. The clock input to the flip-flop circuit is driven by a suitable signal for clocking the flip-flop. For example, it may be provided by a random number generator 1230. In one embodiment, a clocking signal may have a frequency that substantially greater than the frequency of the input clock signals at node 1200 to implement direct sampling. In another embodiment, a sampling clock may have a lower frequency (sub-sampling). In one preferred embodiment, a pseudo random bit sequence (PRBS) generator provides improved performance. The output of the flip-flop circuit 1224 is provided to a counter circuit 1240 which is arranged to count a number of ones as compared to the total count. This ratio of ones to the total count determines the actual or measured duty cycle of the clock signal at node 1222. This measured duty cycle is compared to the expected duty cycle corresponding to the selected PI input code at 1204. The difference between the measured and expected duty cycle represents the PI INL.

FIG. 13 is a graph illustrating an example of PI non-linearity. Here, the difference between the measured and expected duty cycles is mapped to PI code. An example of this type of calculation is as follows. Assume an input clock frequency of 1 GHz. This corresponds to a period of 1 ns or 1000 pico seconds. Also assume an 8-bit PI with the input code set to 25. In this case, the estimated duty cycle would be 25/256 or approximately 10%. If the measure duty cycle is 15%, then the difference or error due to INL at the PI code of 25 equals 5%. This corresponds to 50 ps. This procedure can be repeated as desired with various PI codes, corresponding to various expected duty cycles. The results can be used to plot an INL curve, and to characterize the PI under test. This information can be used to make corrections, including in some embodiments on-chip techniques to reduce the effective PI non-linearity. In other embodiments, INL measurements can be used to select matching pairs or sets of PIs as further discussed below.

Techniques to reduce the effective non-linearity of a PI are presented next. Recall that in general, a PI may be used to generate an output clock signal that has a phase is a mixture of the phases of two input clocks. PIs may have a unit-cell approach, in which case the mixing is done by combining x unit cells connected to clock1 with y unit cells connected to clock2. The PI cells may be variously implemented, for example, using current mode logic (CML), inverter stages, etc.

Figure 14:
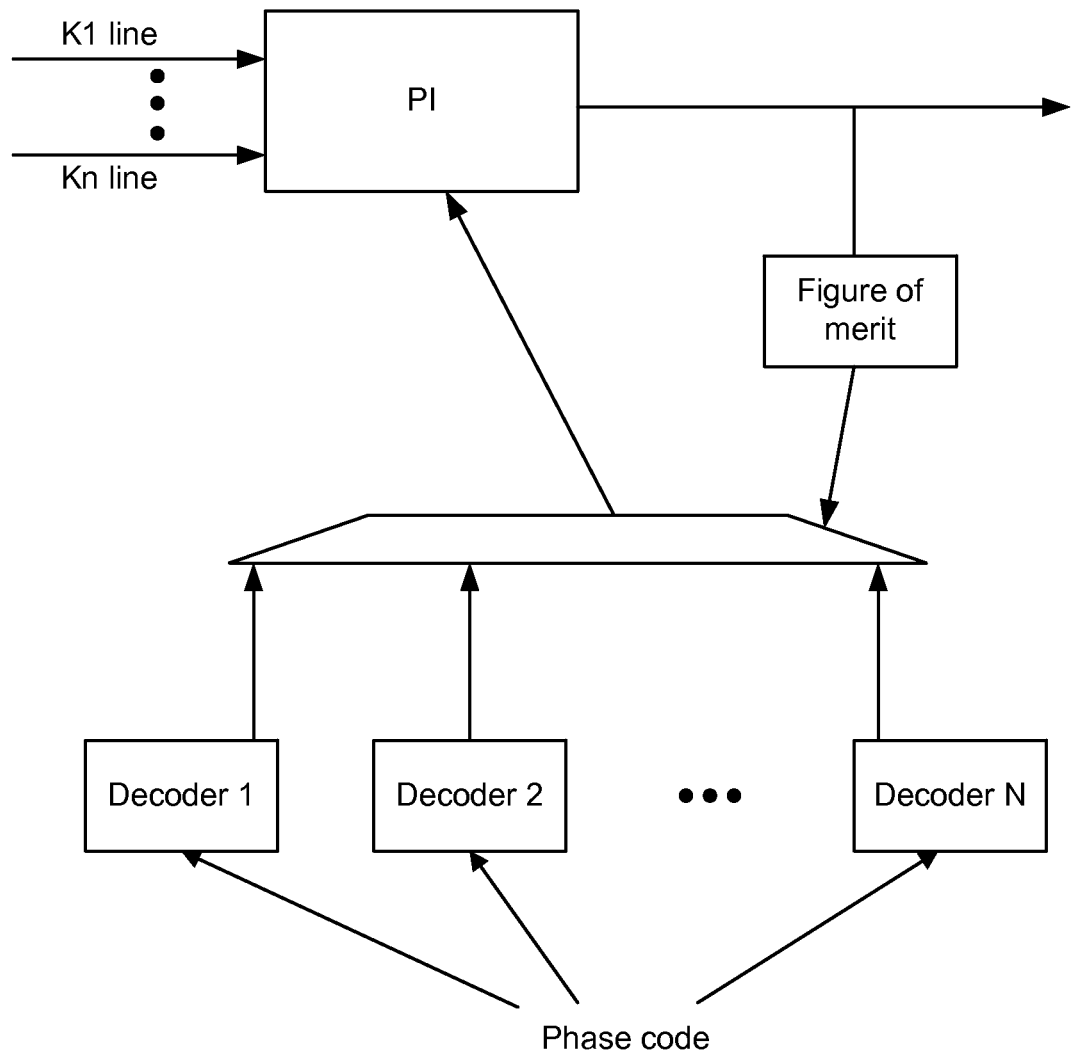
FIG. 14 is a simplified circuit diagram illustrating a method for reducing INL of a PI through judicious selection of phase code decoders.

FIG. 14 is a simplified schematic diagram of circuitry for evaluating decoding alternatives. The boxes labeled Decoder 1, Decoder 2 . . . Decoder N represent alternative phase code decoding schemes. In a traditional approach, a 4-bit PI may be implemented using 1 unit (U), 2U, 4U and 8U cells. The 8U level may be realized as two 4U cells. In this example, we will refer to the three 4U cells as 4U_1, 4U_2 and 4U_3. See Table 1 below.

Suppose during manufacture, post silicon, the cells are measured as having actual values of 1 U, 2U, 3U, 4U, 5U. (These values are listed in Table 1 in the row labeled Magnitude.) In other words, the actual 1 U, 2U and 4U_2 cells are approximately equal to the corresponding nominal input code values. However, 4U_1 is low by one unit, and the 4U_3 is high by one unit. In this case, conventional wisdom may suggest a hard-wired decoding of 4U=4U_1 and 8U=4U_2+4U_3. The output with that decoding would be 3U and 9U, respectively, with resulting INL errors of −1 U and 1U. If nothing else, the "average INL" in this case may be said to be approximately zero. However, matching PIs using this approach can be very difficult.

We propose a new approach generally as follows. Our first illustrative method calls for evaluating all combinations of the available U cells and choosing the combination having the least INL. Here, to illustrate, a first decoding scheme may be the one described in the previous paragraph, in which each decoding, 4U and 8U, results in 1U INL. A second decoding scheme may comprise 4U=4U_2 and 8U=4U_3+4U_1, resulting in outputs 4U and 8U, for 0 INL. A third decoding scheme may comprise 4U=4U_3 and 8U=4U_1+4U_2, resulting in outputs 5U and 7U, again suffering 1U INL. Thus the optimal solution is the second decoding scheme, the one having the least INL. In this way, we can minimize INL by optimizing decoding based on on-chip testing.

Table 1 shows further illustration of an example in which the order of switching on the 4U units is fixed. This simplifies implementation logic. The example below has a maximum INL of 1U.

TABLE 1

A first decoding method with thermometer sequence switching.

| | | Code | | | |
|---|---|---|---|---|---|
| 1U | 2U | 4U_2 | 4U_1 | 4U_3 | |
| | | Magnitude | | | |
| 1 | 2 | 4 | 3 | 5 | Total |
| 0 | Off | Off | Off | Off | Off | 0 |
| 1 | On | Off | Off | Off | Off | 1 |
| ... | | | | | | |
| 7 | On | On | On | Off | Off | 7 |
| 8 | Off | Off | On | On | Off | 7 |
| 9 | On | Off | On | On | Off | 8 |
| ... | | | | | | |
| 15 | On | On | On | On | On | 15 |

In an alternative method, the order of switching on units may be relaxed, resulting in a significantly larger set of possible decoding schemes. In this type of method, it is likely to take longer to determine an optimal decoding. On the other hand, reduced error (INL) may be achieved. An illustration is shown in Table 2 below. In this case, with the ability to switch in any order, the INL can be reduced to zero.

TABLE 2

A second decoding method with more flexible decoding scheme.

| | | Code | | | |
|---|---|---|---|---|---|
| 1U | 2U | 4U_2 | 4U_1 | 4U_3 | |
| | | Magnitude | | | |
| 1 | 2 | 4 | 3 | 5 | Method 2 |
| 0 | Off | Off | Off | Off | Off | 0 |
| 1 | On | Off | Off | Off | Off | 1 |
| ... | | | | | | |
| 7 | On | On | On | Off | Off | 7 |
| 8 | Off | Off | Off | On | On | 8 |
| 9 | On | Off | Off | On | On | 9 |
| ... | | | | | | |
| 15 | On | On | On | On | On | 15 |

The optimum result, determined using either type of methodology, may be implemented, for example, using the multiplexer circuitry shown in FIG. 14.

In another aspect of the disclosure, two PIs may be measured as described above, the NL results used to select or match PIs to achieve accurate delay times between two clock paths, for example, ICLK and QCLK. In an embodiment, a determination is made as to which code Y of PI2 results in say a 90-degree delay with respect to a given code X of PI1. This is straightforward to implement once the INL of the two devices is known.

It will be obvious to those having skill in the art that many changes may be made to the details of the above-described embodiments without departing from the underlying principles of the invention. The scope of the present invention should, therefore, be determined only by the following claims.

What is claimed is:

1. A method of for duty-cycle correction of a clock signal comprising:
   receiving a clock signal in a clock-forwarded serial communication link;
   sampling the received clock signal over a selected number of samples to measure a duty-cycle of the received clock signal;
   estimating a delay to adjust the received clock signal to achieve a desired duty-cycle;
   expressing the delay in terms of a phase code adjustment ($\Delta$) compatible with a predetermined phase interpolator step size; and
   conveying the phase code adjustment ($\Delta$) to a transmitter to adjust the duty-cycle of the clock signal, using a phase interpolator, so as to achieve the desired duty-cycle of the received clock signal.

2. The method of claim 1 wherein the received clock signal comprises quadrature clock signals (ICLK and QCLK) and the method comprises applying the foregoing steps with regard to at least one of the quadrature clock signals.

3. The method of claim 2 wherein the desired duty-cycle is 50% for ICLK and 50% for QCLK so as to support quad data rate sampling of the serial communication link.

4. The method of claim 2 wherein the delay is applied to adjust a falling edge of at least one of the quadrature clock signals so as to maintain alignment of a rising edge of the at least one of the quadrature clock signals.

5. The method of claim 2 further comprising:
   providing a second phase interpolator to generate a sampling clock signal to sample the received clock signal, wherein the second phase interpolator is characterized by the predetermined phase interpolator step size; and
   sampling the received clock signal using the sampling clock signal generated by the second phase interpolator, to translate the delay to adjust the received clock signal into the phase code adjustment ($\Delta$).

6. The method of claim 2 and further comprising conveying the phase code adjustment ($\Delta$) to the transmitter in response to determining that the estimated delay exceeds a predetermined threshold value.

7. The method of claim 2 and further comprising conveying the phase code adjustment ($\Delta$) to the transmitter after expiration of a predetermined time period since a last preceding adjustment.

8. The method of claim 2 and further comprising:
   measuring a quadrature phase error (QPE) of the quadrature clock signals;
   estimating a second delay to correct the quadrature phase error;
   expressing the second delay in terms of a second phase code adjustment compatible with the predetermined phase interpolator step size; and
   conveying the second phase code adjustment to the transmitter to correct the quadrature phase error.

9. The method of claim 8 wherein said measuring the quadrature phase error (QPE) comprises combining the quadrature clock signals to form a local clock signal (IQCLK), arranged so that a duty cycle of the local clock signal (IQCLK) is responsive to the quadrature phase error (QPE) of the quadrature clock signals.

10. The method of claim 9 wherein the local clock signal (IQCLK) exhibits a substantially linear relation to the quadrature phase error.

11. The method of claim 9 wherein a 90-degree phase difference between the quadrature clock signals generates approximately a 25% duty cycle of the local clock signal (IQCLK).

12. The method of claim 2 wherein the desired duty-cycle is within a range of 40% to 60% for ICLK and within a range of 40% to 60% for QCLK.

13. The method of claim 2 wherein sampling the received clock signal comprises:
   providing a second phase interpolator;
   generating multiple different sets of multi-phase clock signals, each set of multi-phase clock signals offset from the other sets;
   inputting a first set of the multi-phase clock signals to the second phase interpolator to generate the sampling clock signal;
   sampling the clock signal responsive to the first set of the multi-phase clock signals;
   repeating said inputting and sampling steps so as to sample the clock signal utilizing at least one additional set of the multi-phase clock signals; and
   combining the respective sample data acquired using multiple different sets of multi-phase clock signals so as to mitigate non-linearity effects of the phase interpolator.

14. The method of claim 13 wherein generating the different sets of multi-phase clock signals comprises:
   dividing a first received clock signal by an integer divisor to form a first set of the multi-phase clock signals; and
   dividing a quadrature received clock signal by the integer divisor to form a second set of the multi-phase clock signals.

15. A serial link transmitter comprising:
   a clock circuit comprising a first phase interpolator (PI) arranged to generate a first clock signal, wherein the first PI is arranged to interpolate among multi-phase clock signals responsive to a first phase code input value;
   a second PI arranged to interpolate among the multi-phase clock signals responsive to a second phase code input value to form a second clock signal; and
   a correction circuit, operatively coupled to the clock circuit and the second PI, to combine the first and second clock signals to form a corrected clock signal.

16. The transmitter of claim 15 wherein the second phase code input value equals the first phase code input value offset by a delta received from a receiver of the serial link.

17. The transmitter of claim 16 wherein the delta is expressed directly in units of a step size of the first and second PIs.

18. The transmitter of claim 17 wherein the delta is selected at the receiver to achieve a 50% duty-cycle of the corrected clock signal as measured at the receiver.

19. A method of for estimating integral non-linearity (INL) comprising:
   providing a source clock input signal to a phase interpolator (PI);
   providing a selected phase code to the PI, the selected phase code associated with an expected duty cycle;
   operating the PI to generate a delayed clock signal responsive to the source clock input signal and the selected phase code;
   combining the source clock signal and the delayed clock signal to form a clock output signal;
   measuring a duty cycle of the clock output signal;
   comparing the measured duty cycle of the clock output signal to the expected duty cycle; and estimating an integral non-linearity (INL) of the PI at the selected phase code, based on the said comparison.

20. The method of claim 19 and further comprising back calculating a delay of the PI for the selected phase code based on the said comparison of the measured duty cycle of the output clock signal to the expected duty cycle.

* * * * *